US008513585B2

(12) United States Patent
Chao et al.

(10) Patent No.: US 8,513,585 B2
(45) Date of Patent: Aug. 20, 2013

(54) OPTICAL THREE-DIMENSIONAL COORDINATE SENSOR SYSTEM AND METHOD THEREOF

(75) Inventors: Paul C. P. Chao, Hsinchu (TW); Tzu-Yang Lin, Taipei (TW); Wei-Dar Chen, Taichung (TW)

(73) Assignee: National Chiao Tung University, Hsinchu (TW)

( * ) Notice: Subject to any disclaimer, the term of this patent is extended or adjusted under 35 U.S.C. 154(b) by 382 days.

(21) Appl. No.: 12/838,755

(22) Filed: Jul. 19, 2010

(65) Prior Publication Data

US 2012/0013486 A1    Jan. 19, 2012

(51) Int. Cl.
*G01B 11/14* (2006.01)
*G01C 3/08* (2006.01)
*G01J 1/42* (2006.01)

(52) U.S. Cl.
USPC ............... 250/206.2; 250/208.2; 356/3.07; 356/4.01; 356/623; 702/150

(58) Field of Classification Search
USPC .......... 250/208.1, 208.2, 208.3, 206.1, 206.2; 356/3.02, 3.03, 3.06, 3.07, 3.08, 4.01, 4.06, 356/4.07, 623; 702/150, 152; 348/308
See application file for complete search history.

(56) References Cited

U.S. PATENT DOCUMENTS

| 5,012,082 | A | * | 4/1991 | Watanabe | 250/208.2 |
|---|---|---|---|---|---|
| 5,220,398 | A | * | 6/1993 | Horn et al. | 356/141.5 |
| 5,587,580 | A | * | 12/1996 | Venier et al. | 250/206.1 |
| 5,770,850 | A | * | 6/1998 | Bowen et al. | 250/203.1 |
| 5,877,849 | A | * | 3/1999 | Ramer et al. | 356/3.01 |
| 6,300,612 | B1 | * | 10/2001 | Yu | 250/208.1 |
| 6,376,868 | B1 | * | 4/2002 | Rhodes | 257/215 |
| 6,396,570 | B2 | * | 5/2002 | Takayanagi et al. | 356/5.01 |
| 6,930,297 | B1 | * | 8/2005 | Nakamura | 250/201.8 |
| 6,947,088 | B2 | * | 9/2005 | Kochi | 348/308 |
| 6,952,003 | B2 | * | 10/2005 | Skurnik et al. | 250/208.2 |
| 6,965,396 | B1 | * | 11/2005 | Strohbehn | 348/171 |
| 7,115,850 | B2 | * | 10/2006 | Niemann et al. | 250/203.4 |
| 7,230,685 | B2 | * | 6/2007 | Suzuki et al. | 356/4.04 |
| 7,436,495 | B2 | * | 10/2008 | Tachino et al. | 356/4.07 |
| 7,773,404 | B2 | * | 8/2010 | Sargent et al. | 365/129 |
| 2004/0036009 | A1 | * | 2/2004 | Takayanagi et al. | 250/208.1 |
| 2004/0085466 | A1 | * | 5/2004 | Herold | 348/248 |
| 2005/0205761 | A1 | * | 9/2005 | Shah | 250/214.1 |
| 2005/0247941 | A1 | * | 11/2005 | Adachi | 257/72 |
| 2006/0180743 | A1 | * | 8/2006 | Chan et al. | 250/208.1 |
| 2007/0218579 | A1 | * | 9/2007 | Lee et al. | 438/48 |
| 2011/0303825 | A1 | * | 12/2011 | Kung et al. | 250/208.2 |
| 2012/0013486 | A1 | * | 1/2012 | Chao et al. | 341/13 |
| 2012/0049047 | A1 | * | 3/2012 | Yin et al. | 250/208.2 |

\* cited by examiner

*Primary Examiner* — John Lee
(74) *Attorney, Agent, or Firm* — WPAT, P.C.; Anthony King

(57) ABSTRACT

The present invention relates an optical three-dimensional coordinate sensor system and method thereof. A plurality of light-emitting modules produce a plurality of light signals, and then a plurality of reflected light signals reflected by an object are received by a plurality of photodetectors. After receiving the reflected light signals, the photodetectors generate a plurality of photocurrents. A plurality of active pixel circuits receive the photocurrents and transform the photocurrents to a plurality of reflective optical voltages. A plurality of differential amplifier circuits (DAC) compare the reflective optical voltages and the background voltages, and then output a plurality of DAC output voltages of the reflected light signals. Afterward, a processing module detects the DAC output voltages and uses an algorithm to calculate the top three of the DAC output voltages to determine the three-dimensional coordinate of the object.

20 Claims, 4 Drawing Sheets

OPTICAL THREE-DIMENSIONAL COORDINATE SENSOR SYSTEM AND METHOD THEREOF

FIELD OF THE INVENTION

The exemplary embodiment(s) of the present invention relates to a sensor system and the method thereof. More specifically, the exemplary embodiment(s) of the present invention relates to an infrared optical three-dimensional coordinate sensor system and the method thereof.

BACKGROUND OF THE INVENTION

In recent years, the LED technology has big progress in the efficiency of brightness, and many applications for displays appear continuously. Also, the optical proximity sensor (OPS) is commonly used in wireless communications, biomolecular sciences, environmental monitoring, and displays. The OPS is developed based on the light signal received by the photo-detector (PD) via the reflections of the measured object. The PD transfers the light signal to the electrical signal. By detecting the intensity of the electrical signal, the OPS can calculate the distance of measured object.

The conventional OPS is used mostly for switches; however, there are limited applications for OPS. Also, the OPS needs to comply with the specific color or shape to effectively detect the object, and it is easily affected by the ambient light or the dark current, which results in a wrong detection. In addition, the OPS has at most two-dimensional detection range (i.e. single plane detection range). Thus, it can not do a three-dimensional coordinate sensing of an object.

SUMMARY

A primary object of the present invention is to provide an infrared optical three-dimensional coordinate sensor system and the method thereof, so as to improve the previous drawbacks of the conventional OPS and provide a better three-dimensional coordinate sensor system.

According to an object of the present invention, an optical three-dimensional coordinate sensor system is provided, comprising a plurality of light-emitting modules, a plurality of sensing modules, and a processing module. The light-emitting modules emit a plurality of light signals to an object. The sensing modules are formed from a plurality of photodetectors, a plurality of active pixel circuits (APCs), a plurality of sampling circuits, and a plurality of differential amplifier circuits (DACs). The photodetectors absorb a plurality of reflected light signals reflected by the object to generate a plurality of photocurrents. Each of the APCs comprises at least one active transistor within a pixel unit cell; the APCs connected to the photodetectors receive the photocurrents and transform the photocurrents to a plurality of reflective optical voltages. Each of the sampling circuits comprises a sampling transistor and a capacitor; the sampling circuits connected to the APCs sample and store the reflective optical voltages. The DACs connected to the sampling circuits receive the reflective optical voltages. Each of the DACs subtracts the reflective optical voltage from a background voltage and multiply a differential gain to the difference. Then, the DACs output a plurality of DAC output voltages of the reflected light signals. Next, the processing module connected to the sensing modules detects the DAC output voltages and uses an algorithm to calculate the top three of the DAC output voltages to determine the three-dimensional coordinate of the object.

To achieve this object, a optical three-dimensional coordinate sensing method according to the present invention comprises the steps of emitting a plurality of light signals to an object by a plurality of light-emitting modules; absorbing a plurality of reflected light signals reflected by the object and generating a plurality of photocurrents by a plurality of photodetectors; receiving the photocurrents and transforming the photocurrents to a plurality of reflective optical voltages by a plurality of active pixel circuits (APCs); sampling and storing the reflective optical voltages by a plurality of sampling circuits; subtracting the reflective optical voltages from a plurality of background voltages and multiplying differential gains to output a plurality of DAC output voltages of the reflected light signals by a plurality of differential amplifier circuits (DACs); and detecting the DAC output voltages and using an algorithm by a processing module to calculate the top three of the DAC output voltages to determine the three-dimensional coordinate of the object.

Herein the APC may be a 2-transistor-APC (2T-APC). The 2T-APC comprises a reset transistor, a row select transistor and a storage capacitor. The source of the reset transistor is connected to a Vdd, the drain of the reset transistor is connected to the drain of the row select transistor, and the source of the row select transistor is connected to the storage capacitor.

Herein the 2T-APC operates in three modes sequentially: reset, integration, and readout. In the reset mode, the reset transistor is switched ON and pre-charges the node Va to 3.3V. At the same time, the row select transistor is switched ON. In the integration mode, the reset transistor is switched OFF and the node Va drops because of the photo-carriers discharging a photocurrent capacitor $C_{PD}$. In the readout mode, the row select transistor is switched OFF and an output voltage of the row select transistor is readout.

In summary of the aforementioned descriptions, the optical three-dimensional coordinate sensor system and the method thereof according to the present invention feature one or more of the following advantages:

(1) The sensing modules have the storage capability; they can reduce the incorrect positioning due to the influence of the background light or charge injection (charge injection).

(2) The system and method thereof reduce the cost of the sensor circuit. It only needs fewer APC to reach a larger area of detection.

(3) The algorithm significantly shortens the reaction time, thereby increases the speed of reaction to reach the required rapid rate of reaction of a wide range.

(4) The system and method thereof achieve low-cost, three-dimensional positioning, and low noise, which is practical for application.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Exemplary embodiments of the present invention are described herein in the context of the optical three-dimensional coordinate sensor system and method thereof.

Figure 1:
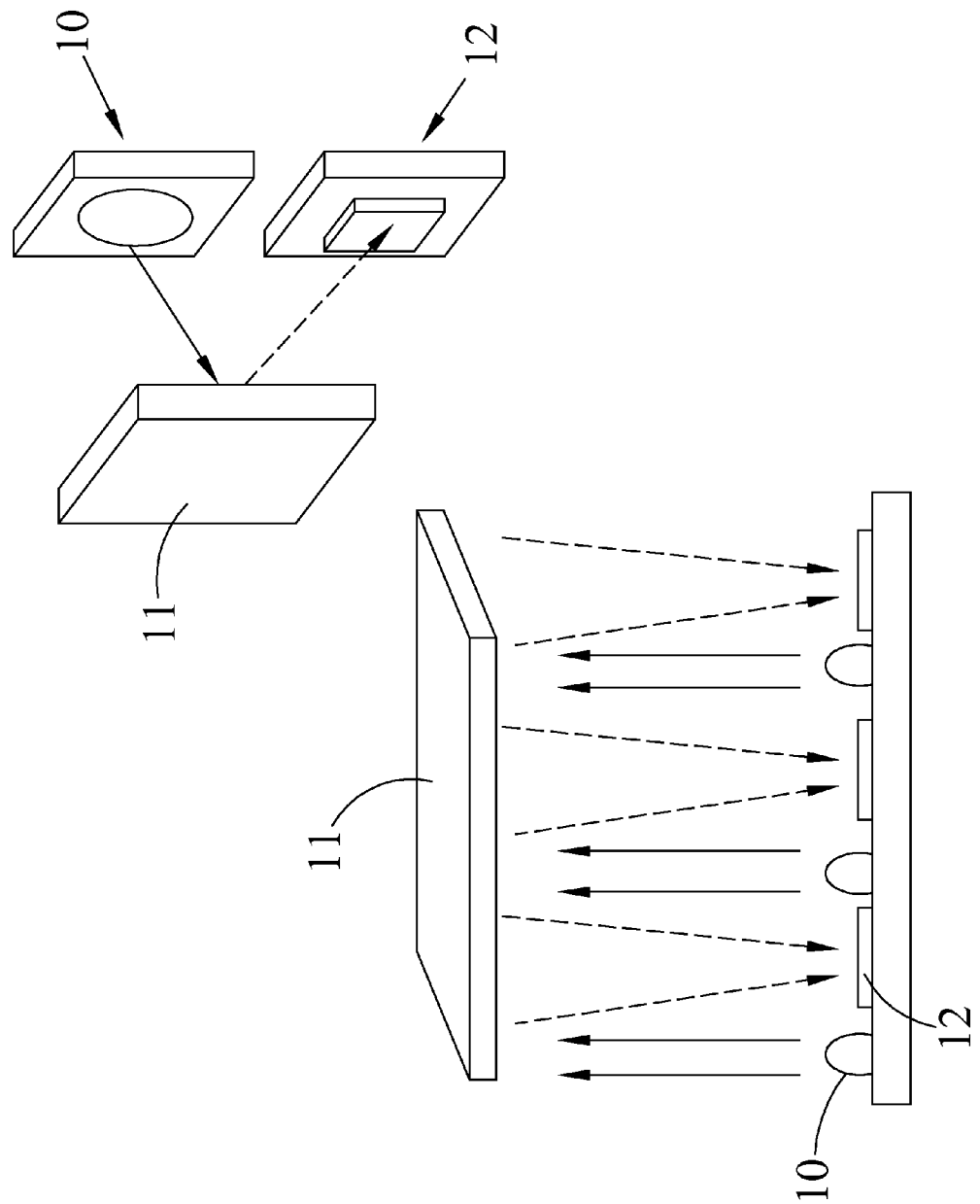
FIG. 1 is the architecture of optical proximity sensor.

Please refer to FIG. 1 which is the architecture of the optical proximity sensor (OPS) according to the present invention. As shown, the OPS comprises light-emitting diodes (LEDs) 10 and polymer photo-detectors (PPDs) 12. The LEDs 10 and the PPDs 12 are disposed side by side in the same plane to form the OPS. Light emitted by the LEDs 10 is reflected from the measured object 11 back onto the PPD pixels.

Figure 2:
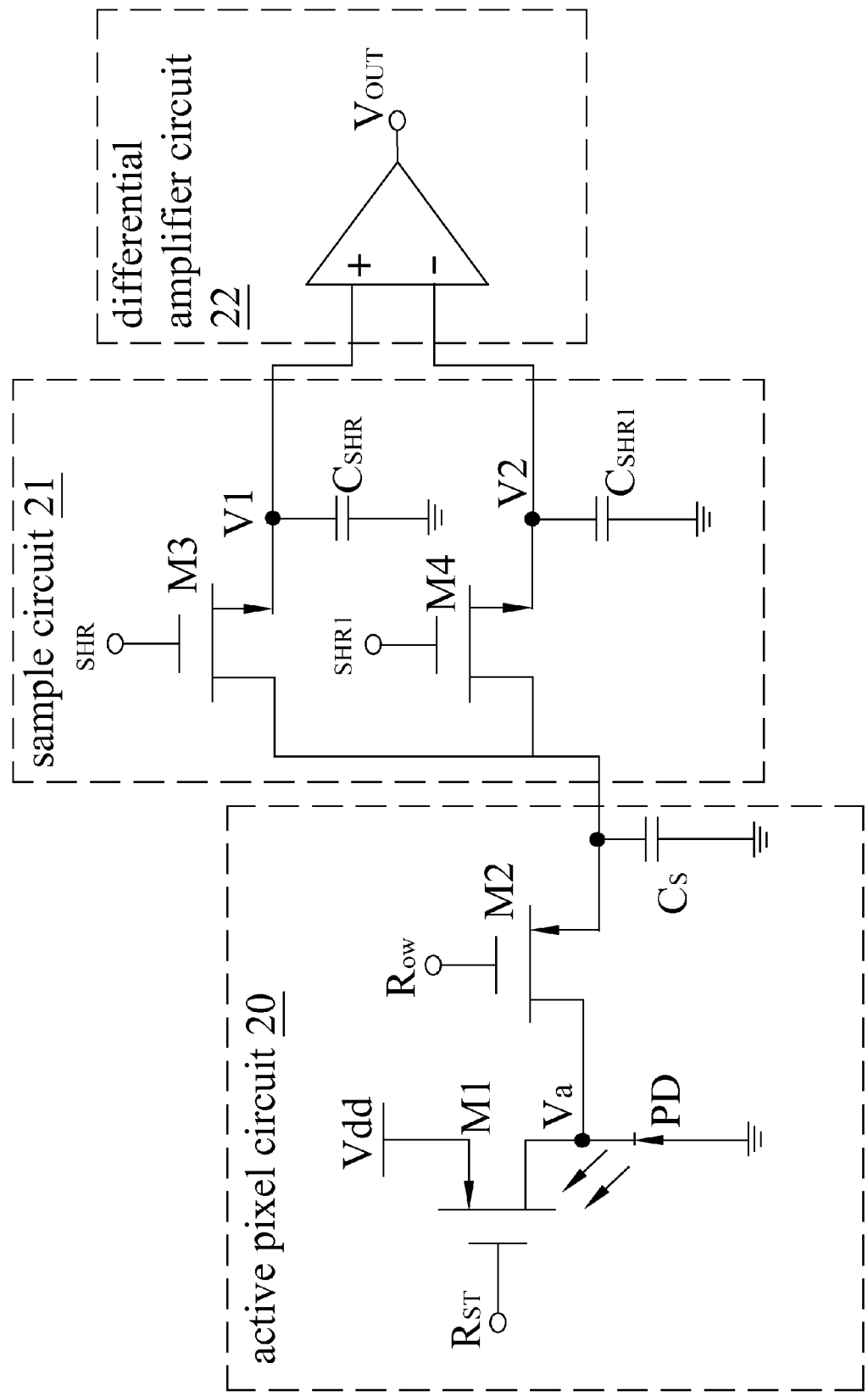
FIG. 2 is a block diagram of the optical three-dimensional coordinate sensor system according to the present invention.

Please refer to FIG. 2 which is a block diagram of the optical three-dimensional coordinate sensor system according to the present invention. As shown, the readout circuit of the OPS comprises an active pixel circuit (APC) 20, a sampling circuit 21, a differential amplifier circuit (DAC) 22 and row decoders.

An APC 20 is defined as a sensor that has one or more active transistors within the pixel unit cell. In the embodiment, the 2-transistor-APC (2T-APC) 20 comprises a polymer photodiode (PPD), a reset transistor (M1), a row select transistor (M2) and a storage capacitor. M1 and M2 adopt PMOS structure. The 2T-APC 20 operates in three modes:

(1) Reset mode: The reset transistor (M1) is switched ON and pre-charges the node Va to 3.3V. The 2T-APC 20 with the storage capacitor can increase the electrical charge and storage ability. At the same time, the row select transistor (M2) is switched ON.

(2) Integration mode: After reset, M1 is switched OFF for an integration period ($T_t$). During $T_t$, photodiode voltage (Va) drops because of the photo-carriers discharging $C_{PD}$.

(3) Readout mode: After integration, the M2 is switched OFF and the $V_{out}$ is readout. Because the M2 acts as an ideal switch ($V_{DS2}=0$), Va is equal to the output voltage of the M2. At the end of integration, the output voltage of the M2 can be expressed as $$I = C\frac{dv}{dt}, \tag{1}$$

$$V_{out} = V_{DD} - \frac{T_t}{C_{in}} I_{PD}, \tag{2}$$

where $T_t$ is the integration time and the capacitance $C_{in}$ represents the photodiode capacitor in parallel with the equivalent capacitance $C_{MOS}$ of MOS transistors seen at node A and storage capacitor $C_S$ $$C_{in} = C_{PD} + C_{gd1} + C_{gd2} + C_S. \tag{3}$$

Each sampling circuit 21 comprises a sampling transistor (M3 or M4) and capacitor (CSHR or CSHR1). At first, the LED is switched OFF in the first reset cycle. The reset transistor (M1) is switched ON and pre-charges Va to 3.3V. At the same time, the row select transistor (M2) is switched ON. After reset, M1 is switched OFF for an integration period (t=t1). During t1, PD generates photo-carriers discharging CPD by ΔQ decreasing Va. Before M2 is switched OFF, V1 is sampled onto capacitor CSHR by pulsing M3 to VDD; V1 is behalf of the background voltage. Next, the LED is switched ON in the second reset cycle. The reset transistor (M1) is switched ON and pre-charges Va to 3.3V. At the same time, the row select transistor (M2) is switched ON. After reset, M1 is switched OFF for an integration period (t=t2). During t2, PD generates photo-carriers discharging CPD by ΔQ decreasing Va. Before M2 is switched OFF, V2 is sampled onto capacitor CSHR1 by pulsing M4 to VDD; V2 is behalf of the background voltage with the voltage of reflective light.

The differential amplifier circuit (DAC) 22 is connected to the sampling circuits 21 for subtracting V2 from V1 and multiplies a differential gain $A_d$ to output the voltage of reflective light $V_{out}$; the voltage of reflective light $V_{out}$ satisfies the following condition:

$$V_{out} = A_d(V_{background} - V_{background+reflection}). \tag{3}$$

Row decoders are used to generate the signals used to scan rows during readout. The array architecture is assumed to be column-parallel so that an entire row can be read out simultaneously. Each column of the array has a column readout amplifier that generates an analog output voltage proportional to the intensity of the incident light.

Figure 3:
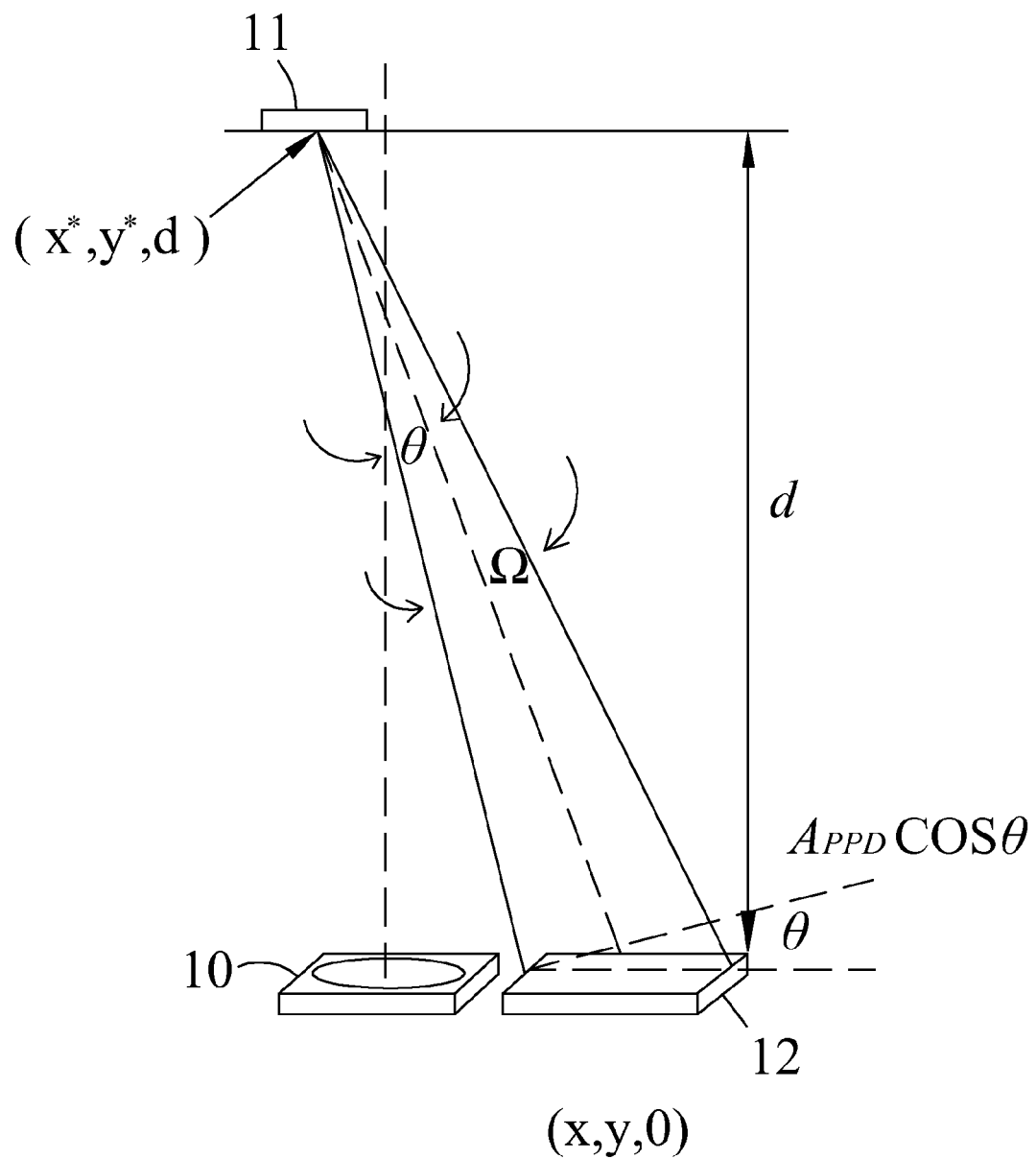
FIG. 3 is a space side view of sensor and light source according to the present invention.

Please refer to FIG. 3 which is a space side view of sensor and light source according to the present invention. As shown, the LED 10 is assumed to be a Lambertian emitter and the object to be a Lambertian reflecting surface. For a Lambertian emitter, the radiant flux that is detected by PPD 12 is proportional to $\cos\theta \times \Omega$, where $\Omega = A_{PPD} \cos\theta/[d^2+(x-x^*)^2+(y-y^*)^2]$ is the solid angle spanned by the PPD 12 to the object 11, d is the distance between the object 11 and the sensor, θ is the angle between the PPD 12 and the object 11, $A_{PPD}$ is the area of the PPD 12 pixel and α is a proportionality factor. Putting all together, one obtains the following expression for the photocurrent $$I_i(x^*, y^*, d) = \frac{\alpha d^2}{[d^2 + (x_i - x^*)^2 + (y_i - y^*)^2]^2}. \tag{4}$$

The position of the PPD 12 is $(x_1, y_1, 0) \ldots (x_9, y_9, 0)$ in 3×3 PPD 12 array, and the position of the object 11 is $(x^*, y^*, d)$. When the object 11 approaches any pixel of array, nine pixels of the PPD 12 generate photocurrent. In addition, the current and the distance of the object 11 are inversely proportional. Thus, $(x^*, y^*, d)$ and the photocurrent related equations are as follows $$\sqrt{\frac{I_i}{\alpha}}[d^2 + (x_i - x^*)^2 + (y_i - y^*)^2] = d, \tag{5}$$

$$\text{Define } K_i = \sqrt{\frac{I_i}{\alpha}} \quad (i = 1 \sim 9), \tag{6}$$

$$K_i[d^2 + (x_i - x^*)^2 + (y_i - y^*)^2] = d$$

And $$V_{out,i} = \frac{A_d T_t}{C_{in}}(I_i), \tag{7}$$

$$\text{Define } \beta = \frac{\alpha A_d T_t}{C_{in}}, \tag{8}$$

$$V_{out,} = \frac{\beta d^2}{[d^2 + (x_i - x^*)^2 + (y_i - y^*)^2]^2}.$$

Figure 4:
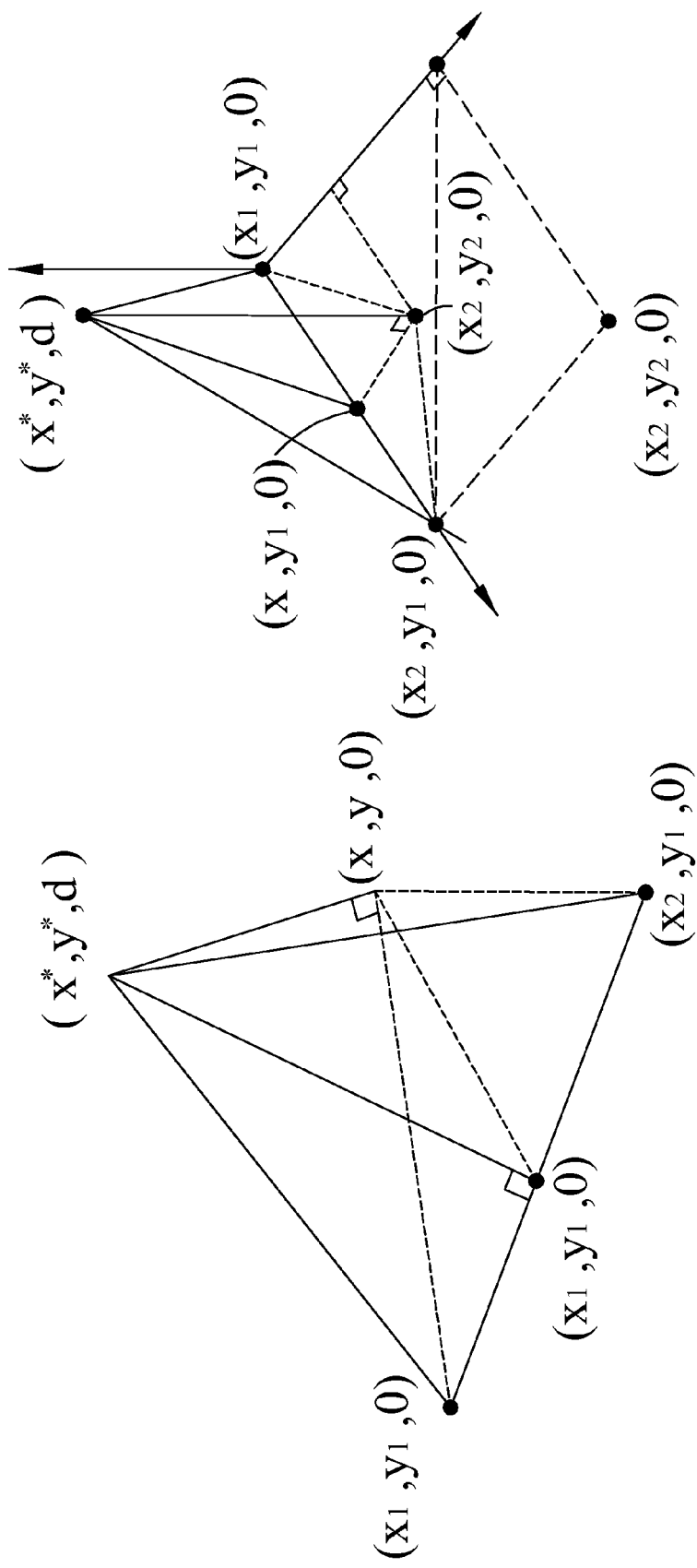
FIG. 4 is a relationship of the position of the object and space coordinates.

The location of the object 11 $(x^*, y^*, d)$ will fall around the large output voltage of the PPD 12. However, a photo-detector can only access a dimension of information, and the point of the space has three dimensions of information. Therefore, the positioning of the sensed object 11 needs three photodetectors, which generate the largest output signals. The relationship of the position of the object and space coordinates shows in FIG. 4. The point of the maximum voltage and the remaining two points form a right triangle in the x-y plane. The sensed object 11 locates in the x-axis or y-axis is determined by the second large voltage. Then, it is necessary to calculate Eq. (9), Eq. (10) and Eq. (11) simultaneously in order to determine the location of the object precisely.

$$V_{out,largest} = \frac{\beta d^2}{[d^2 + (x_1 - x^*)^2 + (y_1 - y^*)^2]^2}, \quad (9)$$

$$V_{out,second} = \frac{\beta d^2}{[d^2 + (x_2 - x^*)^2 + (y_2 - y^*)^2]^2}, \quad (10)$$

$$V_{out,third} = \frac{\beta d^2}{[d^2 + (x_3 - x^*)^2 + (y_3 - y^*)^2]^2}. \quad (11)$$

Use these equations to obtain (x*,y*,d). Finally, make use of the other equation to verify the correctness of the location.

In summary, the optical three-dimensional coordinate sensor system and the method thereof according to the present invention achieve low-cost, three-dimensional positioning, and low noise, which is practical for application.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. An optical three-dimensional coordinate sensor system, comprising:
   a light-emitting module emitting a plurality of light signals to an object;
   a sensing module, comprising:
   a plurality of photodetectors receiving a plurality of reflected light signals reflected by the object to generate a plurality of photocurrents;
   a plurality of an active pixel circuits (APCs), each of the APCs being connected to one of the photodetectors for receiving the photocurrent and transforming the photocurrent to a reflective optical voltage, each of the APCs comprising at least one active transistor within a pixel unit cell;
   a plurality of sampling circuits, each of the sampling circuits being connected to one of the APCs for sampling and storing the reflective optical voltage, each of the sampling circuits comprising a sampling transistor and a capacitor; and
   a plurality of differential amplifier circuits (DACs), each of the DACs being connected to one of the sampling circuits for receiving the reflective optical voltage, each of the DACs subtracting the reflective optical voltage from a background voltage and multiplying a differential gain thereto, the DACs outputting a plurality of DAC output voltages of the reflected light signals; and
   a processing module connected to the sensing modules for detecting the DAC output voltages, picking up three maximum values of the DAC output voltages among all of the DAC output voltages by an algorithm, and inputting the three maximum values of the DAC output voltages into the algorithm to determine a three-dimensional coordinate of the object, wherein the photodetectors, the APCs, the sampling circuits, the DACs, and the processing module are all turned on when the light-emitting modules are emitting the light signals.

2. The optical three-dimensional coordinate sensor system as claimed in claim 1, wherein each of the APCs is a 2-transistor-APC (2T-APC), the 2T-APC comprising a reset transistor, a row select transistor and a storage capacitor; a source of the reset transistor is connected to a Vdd, a drain of the reset transistor is connected to a drain of the row select transistor, and a source of the row select transistor is connected to the storage capacitor.

3. The optical three-dimensional coordinate sensor system as claimed in claim 2, wherein the reset transistor and the row select transistor are PMOS transistors.

4. The optical three-dimensional coordinate sensor system as claimed in claim 2, wherein the 2T-APC operates in a plurality of modes sequentially.

5. The optical three-dimensional coordinate sensor system as claimed in claim 2, wherein the 2T-APC operates in a plurality of modes sequentially.

6. The optical three-dimensional coordinate sensor system as claimed in claim 5, wherein the plurality of modes comprise an integration mode, in which the reset transistor is switched OFF and a node Va drops because of a plurality of photo-carriers discharging the storage capacitor.

7. The optical three-dimensional coordinate sensor system as claimed in claim 6, wherein the plurality of modes comprise a readout mode, in which the row select transistor is switched OFF and an output voltage of the row select transistor is readout.

8. The optical three-dimensional coordinate sensor system as claimed in claim 1, wherein the sensing module comprises a 3×3 polymer photo-detector (PPD) array with 9 PPDs and each of the photodetector is a PPD of the PPD array to realize the determination of the three-dimensional coordinate of the object.

9. The optical three-dimensional coordinate sensor system as claimed in claim 1, wherein the light-emitting module comprises a plurality of light-emitting diodes (LEDs).

10. The optical three-dimensional coordinate sensor system as claimed in claim 8, wherein a radiant flux detected by each PPD in the PPD array is proportional to $\cos\theta \times \Omega$, where $\Omega = A_{PPD}\cos\theta/[d^2+(x-x^*)^2+(y-y^*)^2]$ is a solid angle spanned by the PPD to the object, d is a distance between the object and the PPD, θ is an angle between the PPD and the object, $A_{PPD}$ is an area of each PPD of the PPD array, and (x, y, 0) is the three dimensional coordinates of the PPD, and (x*, y*, d) is the three-dimensional coordinates of the object.

11. The optical three-dimensional coordinate sensor system as claimed in claim 10, wherein the photocurrent detected by each PPD of the PPD array is proportional to the radiant flux, and the photocurrent detected by each PPD in the PPD array satisfies the following condition:

$$I_i(x^*, y^*, d) = \frac{\alpha d^2}{[d^2 + (x_i - x^*)^2 + (y_i - y^*)^2]^2},$$

wherein $(x_i, y_i, 0)$ is a position of the PPD in the 3×3 PPD array, and (x*, y*, d) is the three-dimensional coordinates of the object, and α is a proportionality factor.

12. The optical three-dimensional coordinate sensor system as claimed in claim 11, wherein the three maximum values of the DAC output voltages satisfy the following condition:

$$V_{out,} = \frac{\beta d^2}{[d^2 + (x_i - x^*)^2 + (y_i - y^*)^2]^2},$$

$$\text{wherein } \beta = \frac{\alpha A_d T_t}{C_{in}},$$

$A_d$ is a differential gain, and $T_t$ is an integration time of a capacitance $C_{in}$.

13. An optical three-dimensional coordinate sensing method, comprising the following steps:
   a light-emitting module emitting a plurality of light signals to an object;
   each one of a plurality of photodetectors receiving a plurality of reflected light signals reflected by the object and generating a photocurrent;
   each one of a plurality of active pixel circuits (APCs) receiving the photocurrent of the corresponding photodetector and transforming the photocurrent to a reflective optical voltage;
   each one of a plurality of sampling circuits sampling and storing the reflective optical voltage of the corresponding photodetector;
   each one of a plurality of differential amplifier circuits (DACs) subtracting the reflective the optical voltage of the corresponding sample circuit from a background voltage and multiplying a differential gain thereto to output a differential amplifier circuit (DAC) output voltage of the reflected light signals by each of a plurality of differential amplifier circuits (DACs); and
   a processing module detecting the DAC output voltages and using an algorithm to calculate three maximum values of the DAC output voltages and inputting the three maximum values of the DAC output voltages into the algorithm to determine a three-dimensional coordinate of the object, wherein the photodetectors, the APCs, the sampling circuits, the DACs, and the processing module are all turned on when the light-emitting modules are emitting the light signals.

14. The optical three-dimensional coordinate sensing method as claimed in claim 13, wherein the step of receiving the photocurrents and transforming the photocurrents further comprises the following step:
   providing a 2-transistor-APC (2T-APC) to operate in a plurality of modes sequentially.

15. The optical three-dimensional coordinate sensing method as claimed in claim 14, wherein the plurality of modes comprise a reset mode, in which the reset transistor is switched ON and pre-charges a node Va to 3.3V; also, the row select transistor is switched ON.

16. The optical three-dimensional coordinate sensing method as claimed in claim 15, wherein the plurality of modes comprise an integration mode, in which the reset transistor is switched OFF and the node Va drops because of a plurality of photo-carriers discharging a storage capacitor.

17. The optical three-dimensional coordinate sensing method as claimed in claim 16, wherein the plurality of modes comprise a readout mode, in which the row select transistor is switched OFF and an output voltage of the row select transistor is readout.

18. The optical three-dimensional coordinate sensing method as claimed in claim 13, wherein the step of calculating the three-dimensional coordinate further comprises the following step:
   providing a 3×3 polymer photo-detector (PPD) array with 9 PPDs and each photodetector is a PPD in the PPD array;
   detecting a radiant flux by each polymer photo-detector (PPD), the radiant flux being proportional to cos θ×Ω, wherein $\Omega = A_{PPD} \cos \theta / [d^2 + (x-x^*)^2 + (y-y^*)^2]$ is a solid angle spanned by each PPD of the PPD array to the object, d is a distance between the object and each PPD of the PPD array, θ is an angle between each PPD of the PPD array and the object, $A_{PPD}$ is an area of PPD, in the PPD array and (x, y, 0) is a three dimensional coordinates of each PPD of the PPD array, and (x*, y*, d) is a three-dimensional coordinates of the object.

19. The optical three-dimensional coordinate sensing method as claimed in claim 18, wherein the photocurrent of each PPD in the PPD array is proportional to the radiant flux, and the photocurrent satisfies the following condition:

$$I_i(x^*, y^*, d) = \frac{\alpha d^2}{[d^2 + (x_i - x^*)^2 + (y_i - y^*)^2]^2},$$

wherein $(x_i, y_i, 0)$ is a position of the PPD in a 3×3 PPD array, and (x*, y*, d) is the three-dimensional coordinates of the object, and a is a proportionality factor.

20. The optical three-dimensional coordinate sensing method as claimed in claim 19, wherein the three maximum of the DAC output voltages satisfy the following condition:

$$V_{out,} = \frac{\beta d^2}{[d^2 + (x_i - x^*)^2 + (y_i - y^*)^2]^2},$$

$$\text{wherein } \beta = \frac{\alpha A_d T_t}{C_{in}},$$

$A_d$ is a differential gain, and $T_t$ is an integration time of a capacitance $C_{in}$.

* * * * *